(12) United States Patent
Niimi et al.

(10) Patent No.: US 8,031,537 B2
(45) Date of Patent: Oct. 4, 2011

(54) TIME REDUCTION OF ADDRESS SETUP/HOLD TIME FOR SEMICONDUCTOR MEMORY

(75) Inventors: Makoto Niimi, Aichi (JP); Kenji Nagai, Gifu (JP); Takaaki Furuyama, Gifu (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/987,466

(22) Filed: Jan. 10, 2011

(65) Prior Publication Data

US 2011/0103157 A1    May 5, 2011

Related U.S. Application Data

(62) Division of application No. 12/341,886, filed on Dec. 22, 2008, now Pat. No. 7,889,573.

(30) Foreign Application Priority Data

Dec. 20, 2007    (JP) .................................. 2007-328337

(51) Int. Cl.
    *G11C 7/10* (2006.01)
(52) U.S. Cl. ......... 365/189.05; 365/189.03; 365/189.08; 365/63; 365/51; 365/194
(58) Field of Classification Search ............. 365/189.05, 365/189.03, 63, 51, 194
    See application file for complete search history.

(56) References Cited

U.S. PATENT DOCUMENTS

| | | | |
|---|---|---|---|
| 5,594,704 A | 1/1997 | Konishi et al. | |
| 5,675,808 A | 10/1997 | Gulick et al. | |
| 5,917,729 A | 6/1999 | Naganuma et al. | |
| 5,999,716 A * | 12/1999 | Toyonaga | 716/122 |
| 6,205,062 B1 | 3/2001 | Kim et al. | |
| 6,480,946 B1 | 11/2002 | Tomishima et al. | |
| 6,510,503 B2 | 1/2003 | Gillingham et al. | |
| 6,570,812 B2 | 5/2003 | Kono | |
| 6,597,625 B2 * | 7/2003 | Suzuki et al. | 365/230.08 |
| 6,609,228 B1 * | 8/2003 | Bergeron et al. | 716/113 |
| 6,636,110 B1 | 10/2003 | Ooishi et al. | |
| 6,978,328 B1 | 12/2005 | Osaka et al. | |
| 7,051,310 B2 * | 5/2006 | Tsao et al. | 716/114 |
| 7,161,867 B2 | 1/2007 | Kaku | |
| 7,225,421 B2 | 5/2007 | Migatz et al. | |
| 7,405,362 B2 * | 7/2008 | Choi et al. | 174/250 |
| 7,484,135 B2 | 1/2009 | Matsui | |
| 7,624,366 B2 * | 11/2009 | Alpert et al. | 716/119 |
| 7,697,314 B2 * | 4/2010 | Kim et al. | 365/63 |
| 7,804,692 B2 * | 9/2010 | Lu | 361/763 |
| 7,889,573 B2 * | 2/2011 | Niimi et al. | 365/189.05 |

* cited by examiner

*Primary Examiner* — Viet Nguyen

(57) ABSTRACT

In the storage device of the invention, latch control is performed on a series of signals in response to latch control signals. Latch control terminals are provided to which the latch control signals are input respectively and a plurality of signal terminals to which a series of signals are input. Herein, a plurality of latch circuits is provided so as to correspond to the plurality of signal terminals, respectively. The plurality of latch circuits are located within a specified distance from their associated signal terminals respectively and within a specified distance from the latch control terminals. The delays of signal transmission from the signal terminals to their associated latch circuits can be equalized and the delays of signal transmission from the latch control terminals to which the latch control signals for executing latch control are input to the latch circuits can be equalized. This contributes to a reduction in the skew of the latch characteristics of the signals.

20 Claims, 6 Drawing Sheets

TIME REDUCTION OF ADDRESS SETUP/HOLD TIME FOR SEMICONDUCTOR MEMORY

CROSS REFERENCE TO RELATED APPLICATIONS

This application is a divisional of U.S. patent application Ser. No. 12/341,886, now U.S. Pat. No. 7,889,573 filed Dec. 22, 2008, which claims the priority benefit of JP Application No. 2007-328337, filed Dec. 20, 2007, which is hereby incorporated in its entirety.

FIELD OF THE INVENTION

The present invention relates to a storage device capable of attaining improved latch properties in cases where a signal group composed of a plurality of bits is input. More particularly, the invention relates to a storage device where different latch control signals are used according to operation modes, for improved the latch characteristics of the latch control signals.

BACKGROUND OF THE INVENTION

In the semiconductor integrated circuit disclosed in Patent Document 1, two clock drivers 13, 14 are disposed on the rims of the lower and upper sides, respectively, of a chip 10, as illustrated in FIG. 7. A clock input pad 11 and a clock input buffer 12 are disposed in the central area of the left side. The signal line extending from the clock input buffer 12 to the clock driver 13 is equal in length to the signal line extending from the clock input buffer 12 to the clock driver 14, thereby reducing skew between signals input to the two clock drivers 13, 14.

Other related techniques are disclosed in Patent Documents 2 and 3.

Patent Document 1: JP-A-5-268016
Patent Document 2: JP-A-2003-132674
Patent Document 3: JPA-11-345255

SUMMARY

In the storage device of the invention, latch control is performed on a series of signals in response to latch control signals. There are provided latch control terminals to which latch control signals are input and a plurality of signal terminals to which a series of signals is input. Herein, a plurality of latch circuits is provided so as to correspond to the plurality of signal terminals. The plurality of latch circuits are located at such positions that the distances from the plurality of signal terminals to their associated latch circuits do not exceed a specified range and the distances from the latch control terminals to their associated latch circuits do not exceed a specified range.

In the storage device of the present invention, the delays of signal transmission from the signal terminals to their respective latch circuits are equal to one another and the delays of signal transmission from the latch control terminals for inputting a latch control signal to perform latch control to the latch circuits are equal to one another.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Figure 1:
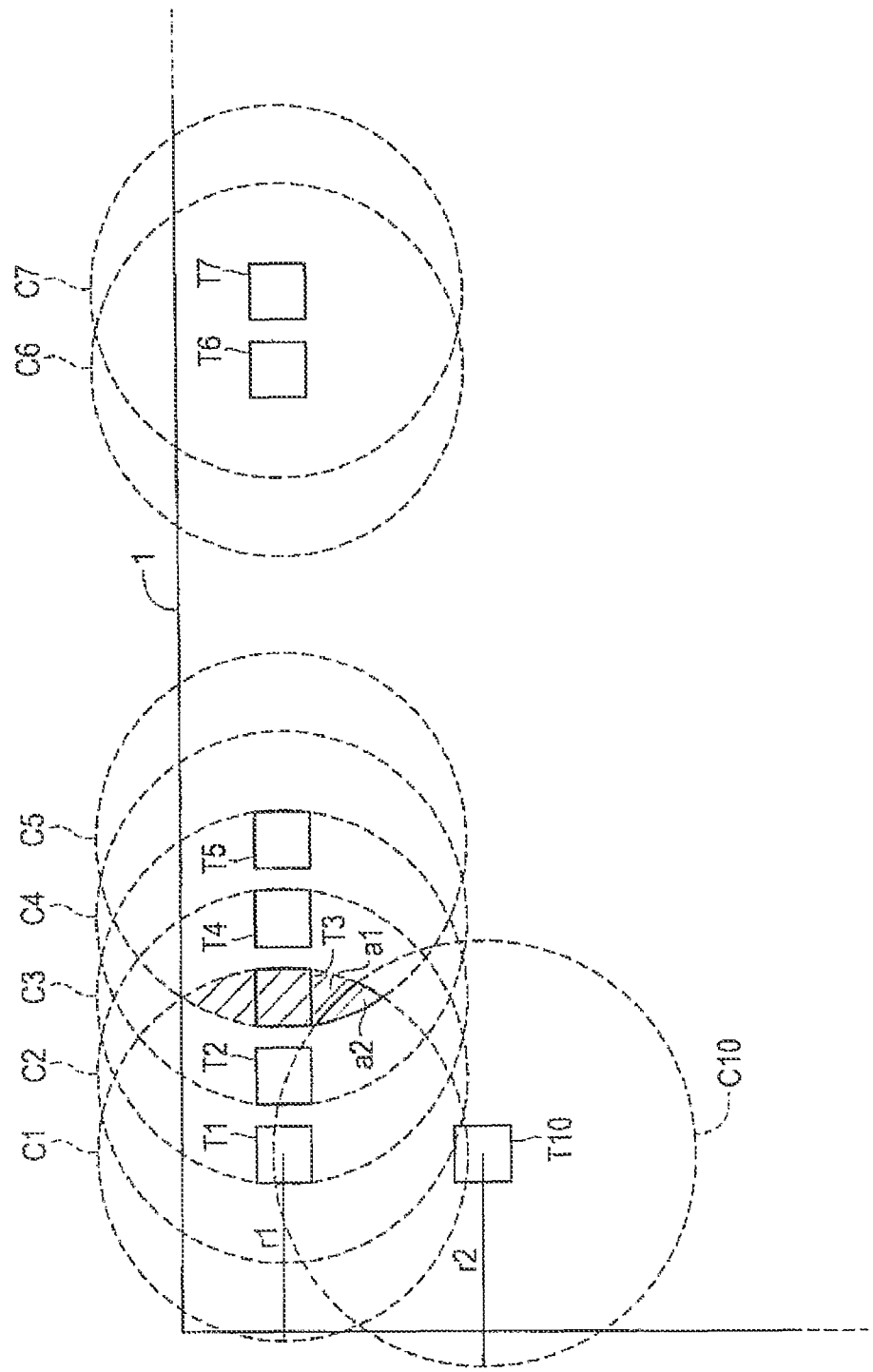
FIG. 1 is an explanatory view illustrating one example of arrangement of terminals in the storage device of the present invention.

Although Patent Document 1 provides an improved skew adjustment for signals input to the two clock drivers 13, 14, the skew between clock signals output from the clock drivers 13, 14 to data input/output blocks 15 still remains unimproved.

More specifically, in Patent Document 1, the positional relationships between the respective data input/output blocks 15 for latching bit data on bits 0 to 31 in synchronization with a clock signal and the clock driver 13 or 14 are not equivalent to each other. The signal lines from the clock drivers 13, 14 to the respective data input/output blocks 15 differ from one another in length. For this reason, the delays of transmission of clock signals output from the clock drivers 13, 14 to the data input/output blocks 15 vary depending upon the locations of the data input/output blocks 15. As a result, a latch timing lag occurs in every data input/output block 15. This results in the setup/hold time of data being unavoidably set to the worst value.

The present invention is directed to overcoming the above problem and a primary object of the invention is therefore to provide a storage device wherein, if latch control signals for latching a signal group vary from operation mode to operation mode, a group of signal terminals which receives a series of signals is disposed in the vicinity of latch control terminals to which the latch control signals are input respectively. With this arrangement, the timings for latch operation performed on the series of signals whenever the latch control signals are released can be equalized between the signals, thereby providing improved latch properties.

According to the storage device of the present invention, the delays of signal transmission from the latch control terminals to the latch circuits can be equalized and the delays of signal transmission from the signal terminals to their associated latch circuits can be equalized. In the latch control performed by the plurality of latch circuits, a timing for latching a signal in response to a latch control signal does not vary signal to signal. Accordingly, the skew in the latch properties of the signals can be reduced and, in consequence, the setup/hold time for the series of signals can be improved.

Referring now to the accompanying drawings, the invention will be described in detail according to preferred embodiments thereof. Reference is first made to FIG. 1 to describe one example of the arrangement of terminals in the storage device of the invention. It should be noted that reference numerals r1, r2 and the like in FIG. 1 are used for illustrative purpose only and therefore do not imply the actual magnitude correlation between the distances or the like. T1 to T7 of Chip 1 represent some of a plurality of signal terminals to which a series of signals are input. C1 to C7 represent regions that are located within a specified distance r1 from the signal terminals T1 to T7, respectively. T10 is one of the latch control terminals, each of which receives a latch control signal for performing latch control on the series of signals. C10 represents a region that is located within a specified distance r2 from the latch control terminal T10.

The signal terminals T1 to T5, having a common regional (hatched part) that is not away from each of the signal terminals T1 to T5 more than the specified distance r1, constitute a terminal group. The latch control terminal T10 is so positioned in relation to the terminal group consisting of the signal terminals T1 to T5 that at least a part of the region C10 that is located within the specified distance r2 from the latch control terminal T10 overlaps at least a part of the common regional. For instance, in FIG. 1, the latch control terminal T10 is positioned such that the region C10 partially overlaps the regional at a region a2 (the portion enclosed by solid line within the hatched part). The inputs of the respective latch circuits for the signal terminals T1 to T5 are positioned within the region a2. Accordingly, the distances from the signal terminals T1 to T5 to their respective latch circuits do not exceed r1 whereas the distances from the latch control terminal T10 to the latch circuits do not exceed r2.

In the present invention, the plurality of signal terminals are thus divided into terminal groups and latch control terminals are provided for every terminal group. The latch circuits are placed within a specified distance from the signal terminals and within a specified distance from the latch control terminals. Thereby, the delays of signal transmission from the signal terminals to their respective circuits can be equalized between signals, and the delays of signal transmission from the latch control terminals to the latch circuits can be equalized between signals. Also, when latch control is performed by the plurality of latch circuits, the timings for latching a series of signal by latch control signals can be equalized between signals. By setting, as r1 and r2, the distances with which the delays of signal transmission from the terminals to the latch circuits become the maximum allowable transmission delay compliant with the specification of the storage device, the skew in the latch properties of the signals can be reduced. This leads to an improvement in the setup/hold time for the series of signals.

Figure 2:
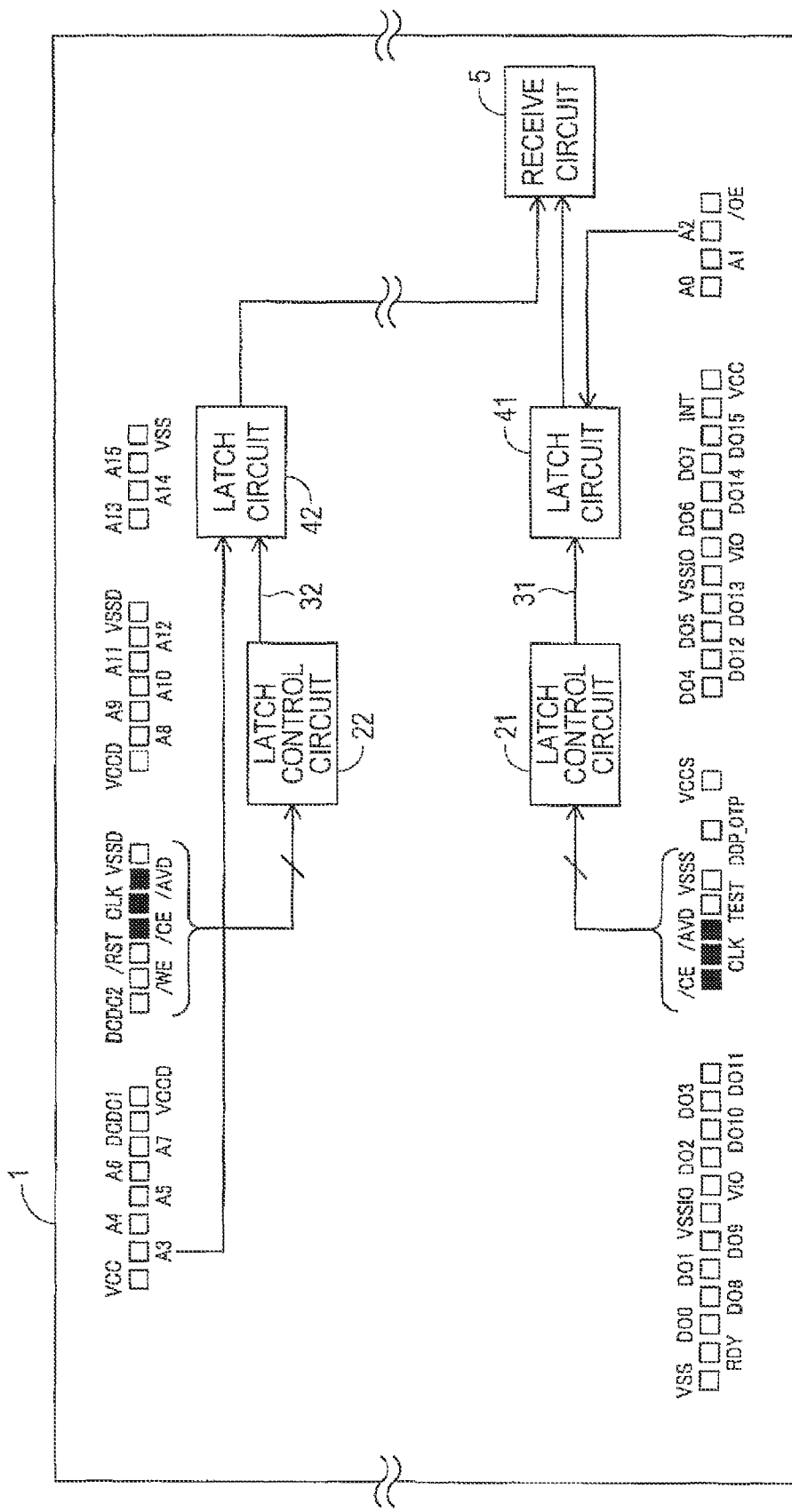
FIG. 2 is a view showing a first embodiment of the present invention.

FIG. 2 shows a first embodiment of the invention. Terminals are provided on the rims of the lower and upper sides of a chip 1. Of the terminals, A0 to A15 are signal terminals to which address signals are input. CLK, /CE, /AVD marked in black are latch control terminals each of which receives a latch control signal. Latch control circuits 21, 22 are provided relative to the latch control terminals on the lower and upper sides, respectively. Latch signals 31, 32 output from the latch control circuits 21, 22 are input to latch circuits 41, 42, respectively. The outputs of the two latch circuits 41, 42 are input to a receive circuit 5.

The address signal terminals A0 to A2 on the lower side constitute a terminal group as explained with reference to FIG. 1. The distances from the address signal terminals A0 to A2 to the latch circuit 41 are not longer than a distance with which the delays of transmission by the signal lines from the address signal terminals A0 to A2 to the latch circuit 41 become the maximum allowable transmission delay compliant with the specification. The distances from the latch control terminals CLK, CE, AVD to the latch circuit 41 are not longer than a distance with which the delay of transmission after a latch control signal is input to each latch control terminal until it is transmitted as a latch signal 31 to the latch circuit 41 through the latch control circuit 21 becomes the maximum allowable transmission delay compliant with the specification.

The address signal terminals A3 to A15 on the upper side also constitute a terminal group as explained with reference to FIG. 1. The distances from the address signal terminals A3 to A15 to the latch circuit 42 are not longer than a distance with which the delays of transmission by the signal lines from the address signal terminals A3 to A15 to the latch circuit 42 become the maximum allowable transmission delay compliant with the specification. The distances from the latch control terminals CLK, CE, AVD to the latch circuit 42 are not longer than a distance with which the delay of transmission after a latch control signal is input to each latch control terminal until it is transmitted as a latch signal 32 to the latch circuit 42 through the latch control circuit 22 becomes the maximum allowable transmission delay compliant with the specification.

As described earlier, in the first embodiment, the plurality of address signal terminals A0 to A15 are divided into two terminal groups and the latch control terminals CLK, CE, AVD are provided for each terminal group. The latch circuits 41, 42 are arranged such that distances from the address signal terminals A0 to A2 to the latch circuit 41; the distances from the address signal terminals A3 to A15 to the latch circuit 42; the distances from the latch control terminals CLK, CE, AVD on the lower side to the latch circuit 41; and the distances from the latch control terminals CLK, CE, AVD on the upper side to the latch circuit 42 do not exceed the distances with which the delays of signal transmission become the maximum allowable transmission delay compliant with the specification.

With the arrangement described above, the delays of signal transmission from the address signal terminals A0 to A15 to their associated latch circuits 41, 42 can be equalized between the signals and the delays of signal transmission from the latch control terminals CLK, CE, AVD to the latch circuits 41, 42 can be equalized between the signals. In the latch control of the plurality of latch circuits 41, 42, the timings for latching a series of address signals by the latch signals 31, 32 in response to the latch control signals CLK, CE, AVD can be equalized between the signals. The latch circuits 41, 42 are each disposed at a position within a distance from the address signal terminals and a distance from the latch control terminals, by which distances, the delay of signal transmission from each terminal to the latch circuit 41 (42) becomes the maximum allowable transmission delay compliant with the specification. As a result, the skew in the latch properties of the signals can be reduced and the setup/hold time for the series of address signals can be improved as discussed earlier with reference to FIG. 1.

Figure 3:
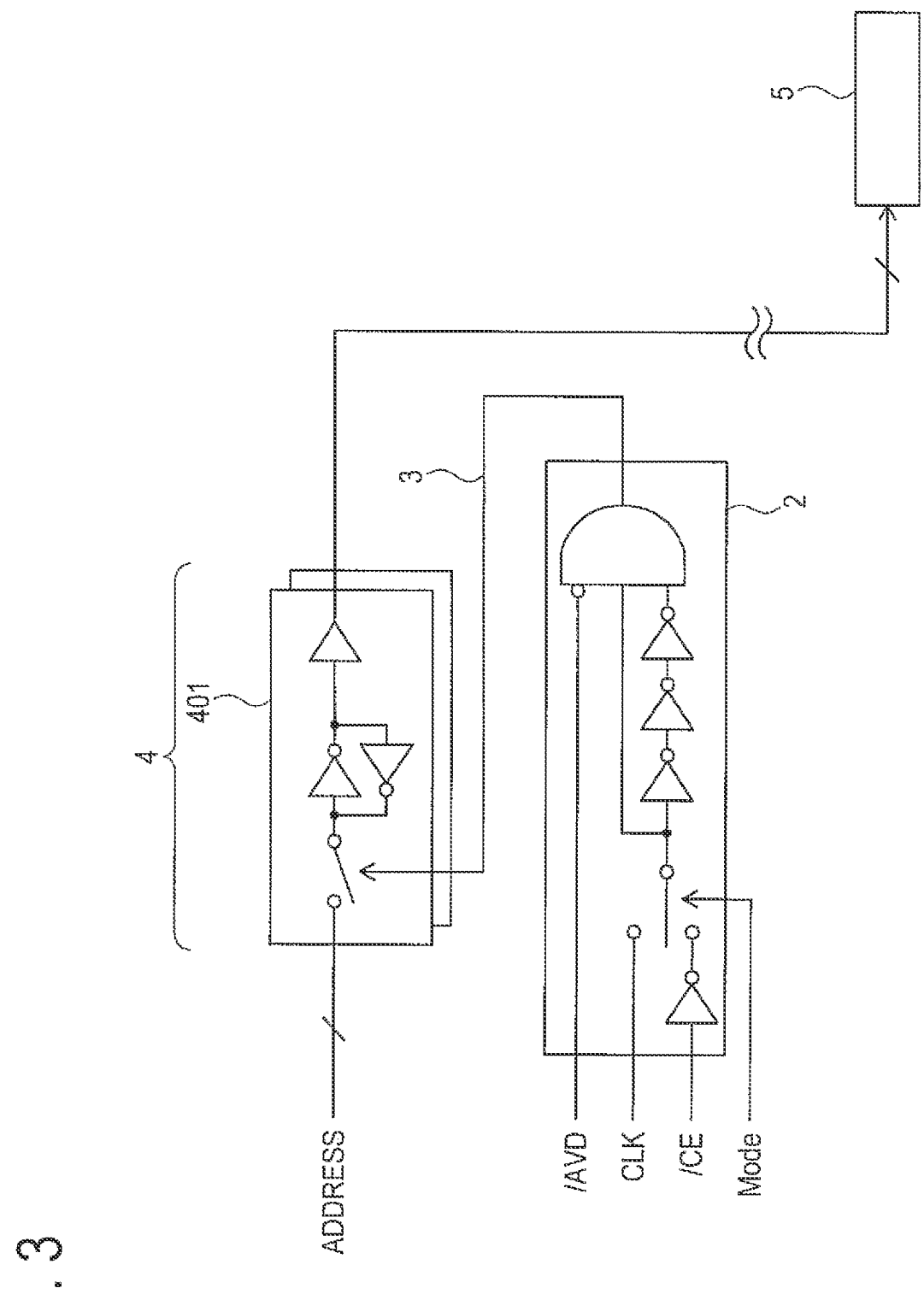
FIG. 3 is a view showing an outline of a circuit configuration of the first embodiment.

FIG. 3 schematically shows one circuit configuration of the latch control circuits 21, 22 and the latch circuits 41, 42 according to the first embodiment shown in FIG. 2. The latch control signals CLK, CE, AVD and a mode signal Mode for making a shift between synchronous mode and asynchronous mode are input to a latch control circuit 2. The latch control circuit 2 is composed of, for instance, a plurality of inverters, an AND gate, and a mode selector switch as illustrated in FIG. 3. The latch control circuit 2 outputs a latch signal 3 to the latch circuit 4. The latch circuit 4 is composed of a plurality of units corresponding to the plurality of address signals respectively, these units having the same configuration represented by the latch circuit unit 401. As illustrated in FIG. 3, each latch circuit unit includes, for instance, a switch that is turned ON and OFF by the latch signal 3, a plurality of inverters, and an output buffer. The output of the latch circuit 4 is input to a receive circuit 5.

Figure 4:
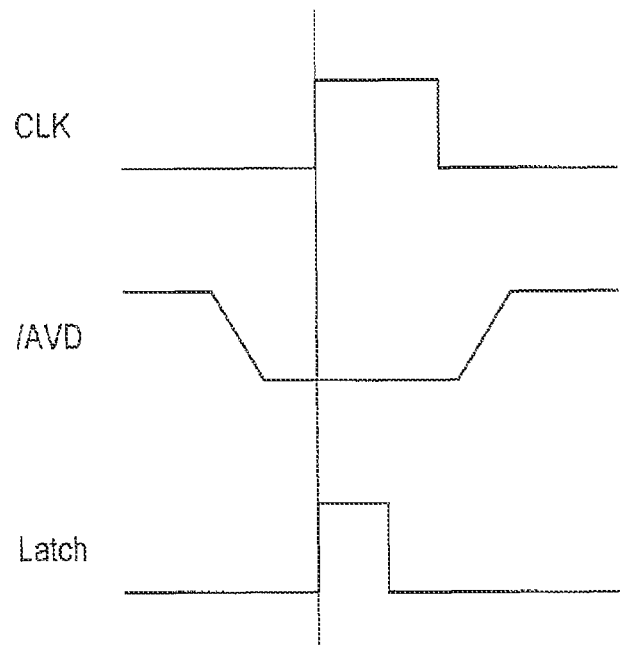
FIG. 4 is a timing chart that outlines generation of a latch signal in the synchronous mode.
Figure 5:
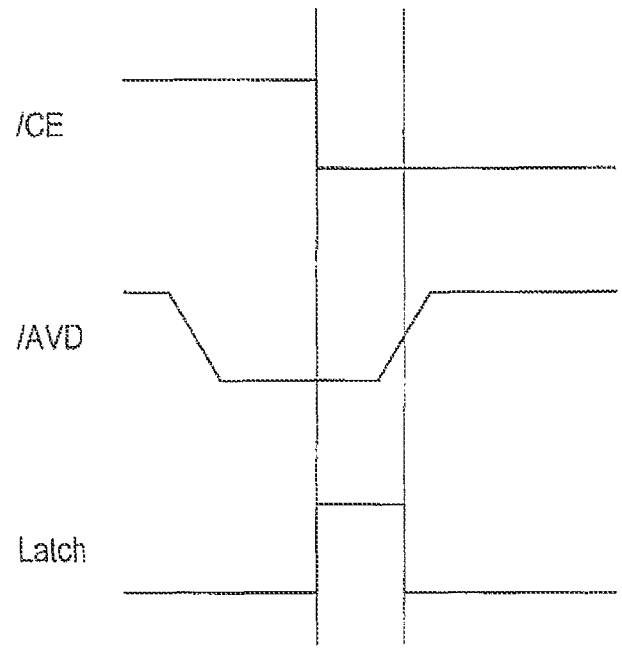
FIG. 5 is a timing chart that outlines generation of a latch signal in the asynchronous mode.

Referring to FIGS. 4 and 5, the generation of the latch signal 3 by the latch control circuit 2 having the above structure and the loading of address signals by the latch circuit 4 will be described with respect to the synchronous mode and the asynchronous mode, respectively. FIG. 4 is a timing chart that outlines the generation of the latch signal 3 by the latch control circuit 2 in the synchronous mode. In the synchronous mode, the latch control signals for controlling the latch signal 3 are CLK and AVD. The latch control circuit 2 generates the latch signal 3 (Latch) with a pulse width corresponding to a specified period from the rising edge of the latch control signal CLK, while the latch control signal AVD is at an L level. More specifically, the loading of an address signal by the latch circuit 4 starts from the rising edge of the latch control signal CLK and the address signal is fixed after an elapse of the specified period.

FIG. 5 is a timing chart that outlines the generation of the 30 latch signal 3 by the latch control circuit 2 in the asynchronous mode. In the asynchronous mode, the latch control signals for controlling the latch signal 3 are CE and AVD. The latch control circuit 2 generates the latch signal 3 (Latch) with a pulse width corresponding to the specified period from the falling edge of the latch control signal /CE to the rising edge of the latch control signal AVD, while the latch control signal AVD is at an L level. More specifically, the loading of an address signal by the latch circuit 4 starts from the falling edge of the latch control signal CE and the address signal is fixed at the rising edge of the latch control signal AVD.

As stated earlier, in the present invention, the latch control terminals, to which the latch control signals CLK, CE, AVD are input, are provided for every address signal terminal group. This leads to an improvement in the latch properties in both the synchronous mode and asynchronous mode.

The elements described in this embodiment correspond to those of Claims as remarked below. The address signal terminals A0 to A15 serve as an example of the series of signals and also serve as an example of the plurality of signal terminals to which the series of signals are input. CLK, CE, AVD serve as an example of the latch control signals for executing latch control on the series of signals and also serve as an example of the latch control terminals to which the latch control signals are input respectively. The latch circuits 4, 41, 42 serve as an example of the plurality of latch circuits. The latch control circuits 2, 21, 22 serve as an example of the latch control circuit. The area a1 serves as an example of the common region.

In the first embodiment of the invention, in cases where latch control signals for latching a signal group vary from operation mode to operation mode, a group of signal terminals which receives a series of signals is disposed in the vicinity of latch control terminals to which the latch control signals are input respectively. With this arrangement, the timings for latch operation performed on the series of signals whenever the latch control signals are released can be equalized between the signals, thereby providing improved latch properties.

The latch circuits are disposed at positions within a distance by which the delay of signal transmission from each terminal to its associated latch circuit becomes the maximum allowable transmission delay compliant with the specification. As a result, skew in the latch properties of the signals can be reduced and the setup/hold time for the series of address signals can be improved.

It is apparent that the invention is not necessarily limited to the particular embodiment shown herein and various changes and modifications are made to the disclosed embodiment without departing from the spirit and scope of the invention. Although the invention has been particularly described with a case where address signals are latched as the series of signals, it is readily apparent that the invention is not limited to this and data signals may be used as the series of signals.

Although the plurality of address signal terminals A0 to A15 are divided into two terminal groups in FIG. 2, the invention is not limited to this. It is conceivable that the address signal terminals could be divided into more than two terminal groups. In addition, the latch properties of all terminal groups in all operation modes can be equalized by setting the distances from the signal terminals of all the terminal groups to their associated latch circuits within the same specified range and setting the distances from all latch control terminals to the latch circuits within the same specified range.

Figure 6:
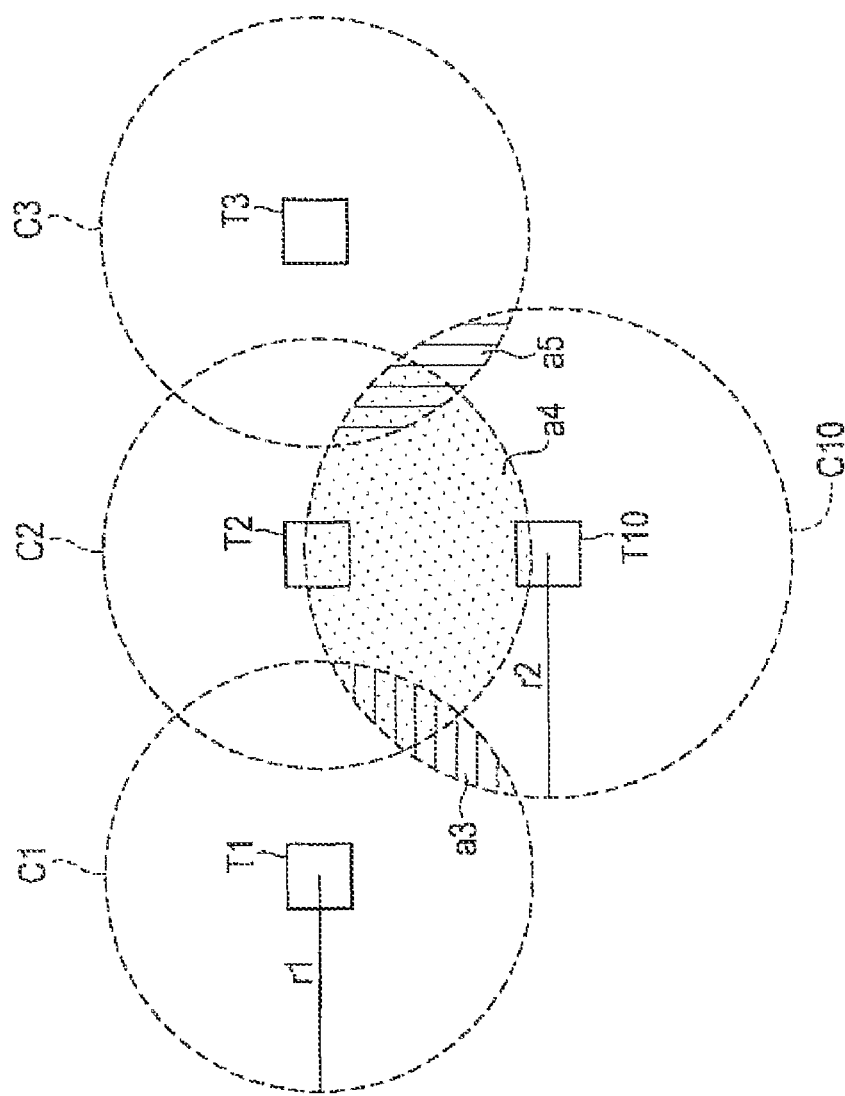
FIG. 6 is an explanatory view illustrating another example of arrangement of terminals in the storage device of the present invention.
Figure 7:
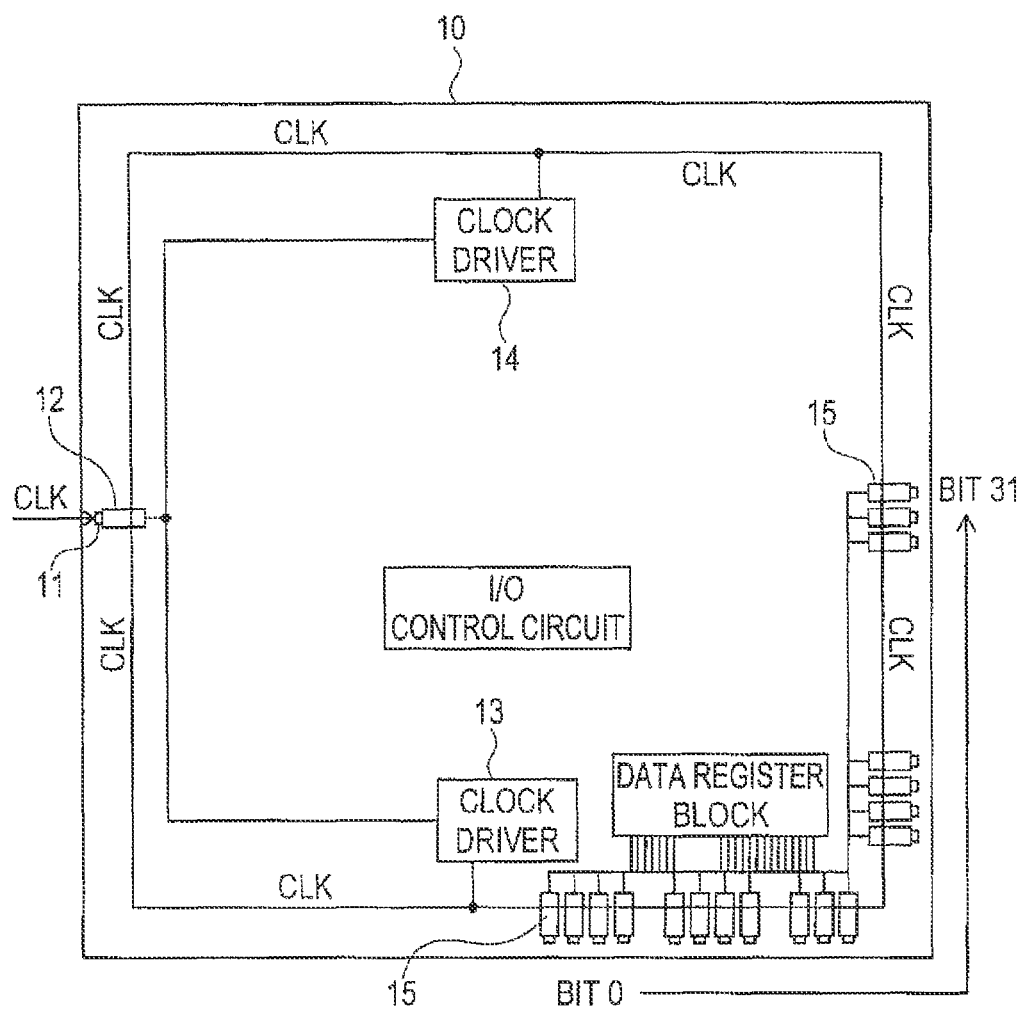
FIG. 7 is an explanatory view showing an outline of the conventional art.

It has been stated, in the foregoing description, that the latch circuits are disposed together in the region (see a2 in FIG. 1) where the common region (see a1 in FIG. 1), which is not away from each signal terminal of a terminal group more than a specified distance, overlaps the region (see C10 in FIG. 1) which is not away from its associated latch control terminal more than a specified distance. However, the invention is not necessarily limited to this. For instance, in a case where a common region which is not away from the signal terminals T1 to T3 more than the specified distance r1 does not exist like the case shown in FIG. 6, the latch control terminal T10 can be disposed relative to the signal terminals T1 to T3 of the terminal group. In such a case, the latch terminal T10 is disposed such that at least a part of the region C10 which is not away from the latch control terminal T10 more than specified distance overlaps at least a part of each of the regions C1 to C3 each of which is not away from its associated signal terminal T1, T2 or T3 more than a specified distance. And, the latch circuits for the signal terminals T1 to T3 are placed in relation to the signal terminals T1 to T3 respectively and separately from one another. More specifically, the latch circuit corresponding to the signal terminal T1 is disposed within the region a3 (marked with lateral lines), the latch circuit corresponding to the signal terminal T2 is disposed within the region a4 (marked with dots), and the latch circuit corresponding to the signal terminal T3 is disposed within the region a5 (marked with vertical lines), so that the distances from the signal terminals T1 to T3 to their associated latch circuits fall within the same specified range r1 and the distances from the latch control terminal T10 to the respective latch circuits fall within the same specified range r2. With this arrangement, the delays of signal transmission from the signal terminals to their associated latch circuits can be equalized between the signals and the delays of signal transmission from the latch control terminals to the latch circuits can be equalized between the signals. Consequently, skew in the latch properties of the signals can be reduced and the setup/hold time for the series of signals can be improved.

What is claimed is:

1. A storage device comprising:
   latch control terminals to which latch control signals for performing latch control on a series of signals are input;
   a plurality of signal terminals to which the series of signals is input;
   a plurality of latch circuits which are provided so as to correspond to the plurality of signal terminals, where the latch control terminal is disposed such that at least a portion of a region which is not away from the latch control terminal more than a specified distance overlaps at least a part of each region which is also not away from an associated signal terminal more than a specified distance; and a first latch circuit corresponding to a first signal terminal is disposed within a first region, a second latch circuit corresponding to a second signal terminal is disposed within a second region, and a third latch circuit corresponding to a third signal terminal is disposed within a third region, so that the distances from the first, second and third terminals to their associated latch circuits fall within a specified range and the distances from the latch control terminal to the respective latch circuits fall within the same specified range; wherein the delays of signal transmission from the signal terminals to their associated latch circuits may be equalized between the signals, and the delays of signal transmission from the latch control terminals to the latch circuits can be equalized between signals.

2. The storage device according to claim 1, wherein the plurality of signal terminals, having a common region that is located within the specified range from each of the signal terminals, constitute a terminal group; and where the latch control terminals are so positioned in relation to the terminal group that at least a part of a region that is located within the specified range from the latch control terminal overlaps at least a part of the common region.

3. The storage device according to claim 1, wherein latch control signals for latching a signal group vary from operation mode to operation mode.

4. The storage device according to claim 2, wherein the signal terminals are divided into two terminal groups.

5. The storage device according to claim 1, wherein the series of signals are address signals.

6. The storage device according to claim 1, wherein the series of signals are data signals.

7. The storage device according to claim 1, wherein the series of signals are address signals and data signals.

8. The storage device according to claim 1, wherein a timing for latching a signal in response to a latch control signal does not vary signal to signal.

9. The storage device according to claim 2, wherein the series of signals are address signals.

10. The storage device according to claim 2, wherein the series of signals are data signals.

11. The storage device according to claim 2, wherein the series of signals are address signals and data signals.

12. The storage device according to claim 1, wherein a timing for latching a signal in response to a latch control signal does not vary signal to signal.

13. A storage device comprising:
latch control terminals to which latch control signals for performing latch control on a series of signals are input;
a plurality of signal terminals to which the series of signals is input;
a plurality of latch circuits corresponding to the plurality of signal terminals;
the plurality of signal terminals, having a common region that is located within a specified range from each of the signal terminals, constitute a terminal group; and where the latch control terminals are so positioned in relation to the terminal group that at least a part of a region that is located within the specified range from the latch control terminal overlaps at least a part of the common region; and a first latch circuit corresponding to a first signal terminal is disposed within a first region, a second latch circuit corresponding to a second signal terminal is disposed within a second region, and a third latch circuit corresponding to a third signal terminal is disposed within a third region, so that the distances from the first, second and third terminals to their associated latch circuits fall within a specified range and the distances from the latch control terminal to the respective latch circuits fall within the same specified range; wherein the delays of signal transmission from the signal terminals to their associated latch circuits may be equalized between the signals, and the delays of signal transmission from the latch control terminals to the latch circuits can be equalized between signals.

14. The storage device according to claim 13, wherein the latch control terminal is disposed such that at least a portion of a region which is not away from the latch control terminal more than a specified distance overlaps at least a part of each region which is also not away from an associated signal terminal more than a specified distance.

15. The storage device according to claim 13, wherein latch control signals for latching a signal group vary from operation mode to operation mode.

16. The storage device according to claim 13, wherein the signal terminals are divided into two terminal groups.

17. The storage device according to claim 13, wherein the series of signals are address signals.

18. The storage device according to claim 13, wherein the series of signals are data signals.

19. The storage device according to claim 13, wherein the series of signals are address signals and data signals.

20. The storage device according to claim 13, wherein a timing for latching a signal in response to a latch control signal does not vary signal to signal.

* * * * *